(12) United States Patent
Kobayashi et al.

(10) Patent No.: US 9,974,169 B2
(45) Date of Patent: May 15, 2018

(54) RESIN COMPOSITION, PREPREG, METAL-FOIL-CLAD LAMINATE, RESIN COMPOSITE SHEET, AND PRINTED WIRING BOARD

(71) Applicant: MITSUBISHI GAS CHEMICAL COMPANY, INC., Tokyo (JP)

(72) Inventors: Takashi Kobayashi, Tokyo (JP); Kentaro Takano, Tokyo (JP); Sotaro Hiramatsu, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days. days.

(21) Appl. No.: 15/501,654

(22) PCT Filed: Jan. 27, 2016

(86) PCT No.: PCT/JP2016/052349
§ 371 (c)(1),
(2) Date: Feb. 3, 2017

(87) PCT Pub. No.: WO2016/125657
PCT Pub. Date: Aug. 11, 2016

(65) Prior Publication Data
US 2017/0231090 A1    Aug. 10, 2017

(30) Foreign Application Priority Data

Feb. 3, 2015  (JP) ................. 2015-019302

(51) Int. Cl.
| | |
|---|---|
| B32B 27/38 | (2006.01) |
| C08G 59/50 | (2006.01) |
| H05K 1/03 | (2006.01) |
| C08G 8/28 | (2006.01) |
| C08J 5/24 | (2006.01) |
| C08G 71/04 | (2006.01) |
| C08K 3/36 | (2006.01) |
| C08K 5/098 | (2006.01) |
| B32B 15/14 | (2006.01) |
| B32B 5/02 | (2006.01) |
| B32B 15/20 | (2006.01) |
| D06M 15/564 | (2006.01) |
| D06M 101/00 | (2006.01) |

(52) U.S. Cl.
CPC .......... H05K 1/0373 (2013.01); B32B 5/024 (2013.01); B32B 15/14 (2013.01); B32B 15/20 (2013.01); C08G 8/28 (2013.01); C08G 71/04 (2013.01); C08J 5/24 (2013.01); C08K 3/36 (2013.01); C08K 5/098 (2013.01); D06M 15/564 (2013.01); B32B 2260/021 (2013.01); B32B 2260/046 (2013.01); B32B 2262/101 (2013.01); B32B 2307/202 (2013.01); B32B 2307/206 (2013.01); B32B 2457/08 (2013.01); C08J 2375/12 (2013.01); D06M 2101/00 (2013.01)

(58) Field of Classification Search
None
See application file for complete search history.

(56) References Cited

U.S. PATENT DOCUMENTS

| | | | |
|---|---|---|---|
| 4,578,422 A | 3/1986 | Sakurai et al. | |
| 4,931,545 A | 6/1990 | Shimp et al. | |
| 2011/0189432 A1 | 8/2011 | Goto et al. | |
| 2013/0101863 A1* | 4/2013 | Mabuchi ............ | C08G 59/5073 428/457 |
| 2013/0281640 A1 | 10/2013 | Tsubuku | |
| 2013/0288063 A1 | 10/2013 | Tsubuku et al. | |
| 2016/0176827 A1 | 6/2016 | Kanbara et al. | |
| 2016/0237246 A1 | 8/2016 | Arii et al. | |

FOREIGN PATENT DOCUMENTS

| | | |
|---|---|---|
| CN | 103347930 A | 10/2013 |
| JP | 61-233013 | 10/1986 |
| JP | 62-48683 | 10/1987 |
| JP | 2-49339 | 10/1990 |
| JP | 6-271669 | 9/1994 |

(Continued)

OTHER PUBLICATIONS

International Search Report issued in Patent Application No. PCT/JP2016/052349, dated Mar. 15, 2016.

*Primary Examiner* — Coris Fung
(74) *Attorney, Agent, or Firm* — Greenblum & Bernstein, P.L.C.

(57) ABSTRACT

A resin composition for a printed wiring board containing a cyanate compound (A); a maleimide compound (B); and a benzoguanamine compound (C) having an aminomethyl group represented by the following general formula (1):

$$\underset{R}{\underset{n(H_2NH_2C)}{\diagdown}}\!\!\!\!\!\!\!\!\!\!\!\!\!\!\!\!\!\!\!\!\!\!\diagup\!\!\!\!\diagdown_{N}^{NH_2}\diagdown_{N}^{}\diagup\!\!\!\!\diagdown_{NH_2} \quad (1)$$

wherein R is a hydrogen atom or a substituent selected from a group consisting of a hydrocarbon group having 1 to 10 carbon atoms, an alkoxyl group having 1 to 10 carbon atoms, an aryloxy group having 6 to 10 carbon atoms, a hydroxyl group, an amide group, and a halogen atom, and n is an integer of 1 to 2.

10 Claims, No Drawings

(56) References Cited

FOREIGN PATENT DOCUMENTS

| | | |
|---|---|---|
| JP | H07-010850 A | 1/1995 |
| JP | 11-124433 | 5/1999 |
| JP | 3081996 | 6/2000 |
| JP | 2000-191776 | 7/2000 |
| JP | 2011-174082 | 9/2011 |
| JP | 5413522 | 2/2014 |
| WO | 2012/057144 | 5/2012 |
| WO | 2012/105547 | 8/2012 |
| WO | 2015/019777 | 2/2015 |
| WO | 2015/060266 | 4/2015 |

* cited by examiner

RESIN COMPOSITION, PREPREG, METAL-FOIL-CLAD LAMINATE, RESIN COMPOSITE SHEET, AND PRINTED WIRING BOARD

TECHNICAL FIELD

The present invention relates to a resin composition, a prepreg, a metal foil-clad laminate, a resin composite sheet, a printed wiring board, and the like.

BACKGROUND ART

In recent years, higher integration and miniaturization of semiconductors widely used in electronic equipment, communication instruments, personal computers, and the like have accelerated increasingly. With this, various characteristics required of laminates for semiconductor packages used in printed wiring boards have become increasingly strict. Examples of the required characteristics include characteristics such as low water absorbency, moisture absorption heat resistance, flame retardancy, a low dielectric constant, a low dielectric loss tangent, a low thermal expansion coefficient, heat resistance, chemical resistance, and high plating peel strength. But, these required characteristics have not always been satisfied so far.

Conventionally, as resins for printed wiring boards having excellent heat resistance and electrical characteristics, cyanate compounds are known, and a resin composition using a bisphenol A-based cyanate compound and another thermosetting resin and the like is widely used for printed wiring board materials and the like. The bisphenol A-based cyanate compound has characteristics excellent in electrical characteristics, mechanical characteristics, chemical resistance, and the like but may be insufficient in low water absorbency, moisture absorption heat resistance, and flame retardancy, and therefore for the purpose of further improving characteristics, various cyanate compounds having different structures are studied.

For example, as a resin having a structure different from the bisphenol A-based cyanate compound, a novolac-based cyanate compound is often used (for example, see Patent Literature 1), but there are problems such as the novolac-based cyanate compound being likely to be insufficiently cured, and the water absorption rate of the obtained cured product being high and the moisture absorption heat resistance decreasing. As a method for improving these problems, prepolymerization of a novolac-based cyanate compound and a bisphenol A-based cyanate compound is proposed (for example, see Patent Literature 2).

In addition, as a method for improving copper foil peel strength and plating peel strength, a method of surface-treating a filler is proposed (for example, see Patent Literatures 3 and 4).

Further, as a method for improving flame retardancy, a halogen-based compound being contained in a resin composition by using a fluorinated cyanate compound or mixing or prepolymerizing a cyanate compound and a halogen-based compound is proposed (for example, see Patent Literatures 5 and 6).

CITATION LIST

Patent Literature

Patent Literature 1: Japanese Patent Laid-Open No 11-124433

Patent Literature 2: Japanese Patent Laid-Open No. 2000-191776
Patent Literature 3: Japanese Patent No. 5413522
Patent Literature 4: Japanese Patent Laid-Open No. 2011-174082
Patent Literature 5: Japanese Patent No. 3081996
Patent Literature 6: Japanese Patent Laid-Open No. 6-271669

SUMMARY OF INVENTION

Technical Problem

However, in Patent Literature 2, the curability is improved by prepolymerization, but characteristics improvements in low water absorbency and moisture absorption heat resistance are still insufficient, and therefore further improvements in low water absorbency and moisture absorption heat resistance are required.

In addition, in Patent Literatures 3 and 4, heat resistance is still insufficient, and a further improvement in heat resistance is required.

Further, when a halogen-based compound is used as in Patent Literatures 5 and 6, a harmful substance such as dioxin may be generated during combustion. Therefore, it is required to improve flame retardancy without comprising a halogen-based compound.

The present invention has been made in view of the above problems, and an object of the present invention is to provide a resin composition that can realize a prepreg, a metal foil-clad laminate, a resin composite sheet, a printed wiring board, and the like having excellent copper foil peel strength and plating peel strength, a prepreg using the resin composition, a metal foil-clad laminate using the prepreg, a resin composite sheet, a printed wiring board using the above resin composition, and the like.

Solution to Problem

The present inventors have studied diligently in order to solve the above problems, and, as a result, found that the above problems can be solved by using a resin composition containing a cyanate compound (A), a maleimide compound (B), and a benzoguanamine compound (C) having an aminomethyl group, arriving at the present invention.

Specifically, the present invention is as follows.

[1]
A resin composition comprising:
a cyanate compound (A);
a maleimide compound (B); and
a benzoguanamine compound (C) having an aminomethyl group represented by the following general formula (1):

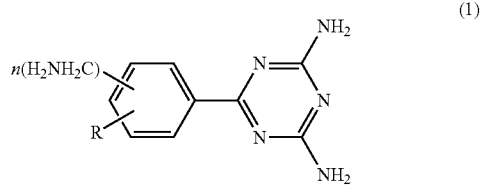

(1)

wherein R is a hydrogen atom or a substituent selected from the group consisting of a hydrocarbon group having 1 to 10 carbon atoms, an alkoxyl group having 1 to 10 carbon atoms, an aryloxy group having 6 to 10 carbon atoms, a hydroxyl group, an amide group, and a halogen atom, and n is an integer of 1 to 2.

[2]
The resin composition according to [1], wherein
the benzoguanamine compound (C) comprises a m-aminomethylbenzoguanamine and/or p-aminomethylbenzoguanamine.

[3]
The resin composition according to [1] or [2], wherein
a content of the benzoguanamine compound (C) is 0.5 to 30 parts by mass based on 100 parts by mass of resin solid components.

[4]
The resin composition according to any one of [1] to [3], further comprising:
a filler (D).

[5]
The resin composition according to any one of [1] to [4], further comprising:
one or more components selected from the group consisting of an epoxy resin, a phenolic resin, an oxetane resin, a benzoxazine resin, and a compound having a polymerizable unsaturated group.

[6]
The resin composition according to [4] or [5], wherein
a content of the filler (D) is 50 to 1600 parts by mass based on 100 parts by mass of the resin solid components.

[7]
A prepreg comprising:
a base material; and
the resin composition according to any one of [1] to [6] with which the base material is impregnated or coated.

[8]
A metal foil-clad laminate comprising:
the prepreg according to [7] or a laminate of two or more of the prepregs; and
metal foil disposed on one surface or both surfaces of the prepreg or the laminate.

[9]
A resin composite sheet comprising:
a support; and
the resin composition according to any one of [1] to [6] with which the support is coated and which is dried.

[10]
A printed wiring board comprising:
an insulating layer; and
a conductor layer formed on a surface of the insulating layer, wherein
the insulating layer comprises the resin composition according to any one of [1] to [6].

Advantageous Effect of Invention

According to the present invention, a resin composition that can realize a prepreg, a metal foil-clad laminate, a resin composite sheet, a printed wiring board, and the like having excellent copper foil peel strength and plating peel strength, a prepreg using the resin composition, a metal foil-clad laminate using the prepreg, a resin composite sheet, a printed wiring board using the above resin composition, and the like can be provided.

In addition, according to a preferred aspect of the present invention, a resin composition comprising only non-halogen-based compounds (in other words, a resin composition comprising no halogen-based compound or a non-halogen-based resin composition), a prepreg, a metal foil-clad laminate, a resin composite sheet, a printed wiring board, and the like can also be realized, and their industrial practicality is extremely high.

DESCRIPTION OF EMBODIMENT

A mode for carrying out the present invention (hereinafter referred to as "the present embodiment") will be described in detail below, but the present invention is not limited to this, and various modifications can be made without departing from the spirit thereof.

[Resin Composition]
A resin composition in the present embodiment comprises a cyanate compound (A); a maleimide compound (B); and a benzoguanamine compound (C) having an aminomethyl group represented by the following general formula (1). The components will be described below.

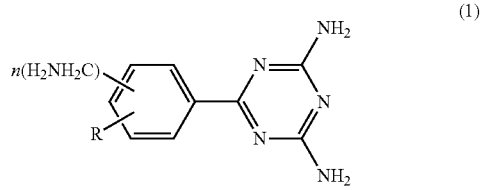

(1)

wherein R is a hydrogen atom or a substituent selected from the group consisting of a hydrocarbon group having 1 to 10 carbon atoms, an alkoxyl group having 1 to 10 carbon atoms, an aryloxy group having 6 to 10 carbon atoms, a hydroxyl group, an amide group, and a halogen atom, and n is an integer of 1 to 2.

[Cyanate Compound (A)]
The type of the cyanate compound (A) used in the present embodiment is not particularly limited as long as it is a resin having in the molecule an aromatic moiety substituted by at least one cyanato group (cyanate group). By using the cyanate compound (A) in combination with the maleimide compound (B) and the benzoguanamine compound (C), the glass transition temperature and the plating adhesiveness are more improved, and the thermal expansion coefficient is more decreased.

The cyanate compound (A) is not particularly limited. Examples thereof include one represented by the following general formula (2):

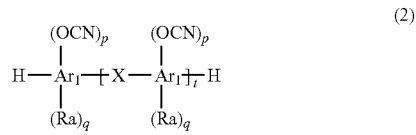

(2)

wherein $Ar_1$ each independently represents a phenylene group that may have a substituent, a naphthylene group that may have a substituent, or a biphenylene group that may have a substituent, Ra each independently represents a hydrogen atom, an alkyl group having 1 to 6 carbon atoms that may have a substituent, an aryl group having 6 to 12 carbon atoms that may have a substituent, an alkoxyl group having 1 to 4 carbon atoms that may have a substituent, an aralkyl group that may have a substituent in which an alkyl group having 1 to 6 carbon atoms and an aryl group having 6 to 12 carbon atoms are bonded to each other, or an alkylaryl group that may have a substituent in which an alkyl group having 1 to 6 carbon atoms and an aryl group having 6 to 12 carbon atoms are bonded to each other, p represents the number of cyanato groups bonded to $Ar_1$ and is an integer of 1 to 3, q represents the number of Ra bonded to $Ar_1$ and is 4-p when $Ar_1$ is a phenylene group, 6-p when $Ar_1$ is a naphthylene group, and 8-p when $Ar_1$ is a biphenylene group, and t represents the average number of repetitions and is an integer of 0 to 50, and the cyanate compound may be a mixture of compounds having different t; and X each independently represents a single bond, a divalent organic group having 1 to 50 carbon atoms (a hydrogen atom may be replaced by a heteroatom), a divalent organic group having 1 to 10 nitrogen atoms (—N—R—N— or the like), a carbonyl group (—CO—), a carboxy group (—C(=O)O—), a carbonyl dioxide group (—OC(=O)O—), a sulfonyl group (—SO$_2$—), or a divalent sulfur atom or a divalent oxygen atom.

$Ar_1$ in general formula (2) is a group in which a hydrogen atom at any position is replaced by an Ra group, a cyanato group, or an X group, and each independently represents a phenylene group that may have a substituent, a naphthylene group that may have a substituent, or a biphenylene group that may have a substituent.

The alkyl group for Ra in general formula (2) may have a linear structure, a branched structure, or a cyclic structure (cycloalkyl group or the like). Such an alkyl group is not particularly limited. Examples thereof include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

The aryl group having 6 to 12 carbon atoms for Ra in general formula (2) is not particularly limited. Examples thereof include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, an o-, m-, or p-tolyl group, an aryl group in which at least one hydrogen atom is replaced by a phenolic hydroxy group, and an aryl group in which at least one hydrogen atom is replaced by a cyanato group.

The alkoxyl group having 1 to 4 carbon atoms for Ra in general formula (2) may have a chain structure, a branched structure, or a cyclic structure. Such an alkoxyl group is not particularly limited. Examples thereof include a methoxy group, an ethoxy group, a propoxy group, an isopropoxy group, a n-butoxy group, an isobutoxy group, and a tert-butoxy group.

A hydrogen atom in the alkyl group, the aryl group, the alkoxy group, the aralkyl group, and the alkylaryl group for Ra in general formula (2) may be replaced by a halogen atom such as fluorine or chlorine; an alkoxyl group such as a methoxy group or a phenoxy group; a cyano group; or the like.

The divalent organic group having 1 to 50 carbon atoms for X in general formula (2) is not particularly limited. Examples thereof include a methylene group, an ethylene group, a trimethylene group, a propylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as fluorine or chlorine; an alkoxyl group such as a methoxy group or a phenoxy group; a cyano group; or the like.

The divalent organic group having 1 to 10 nitrogen atoms for X in general formula (2) is not particularly limited. Examples thereof include an imino group and a polyimide group.

In addition, examples of X in general formula (2) include a group represented by the following general formula (3), a group represented by the following general formula (4), or a divalent group selected from the group consisting of structures represented by the following general formulas (5a), (5b), (5c), (5d), (5e), (5f), (5g), (5h), (5i), and (5j).

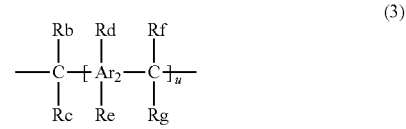

(3)

wherein $Ar_2$ each independently represents a phenylene group that may have a substituent, a naphthylene group that may have a substituent, or a biphenylene group that may have a substituent, Rb, Rc, Rf, and Rg each independently represent a hydrogen atom, an alkyl group having 1 to 6 carbon atoms that may have a substituent, or an aryl group having 6 to 12 carbon atoms that may have a substituent, Rd and Re each independently represent a hydrogen atom, an alkyl group having 1 to 6 carbon atoms that may have a substituent, an aryl group having 6 to 12 carbon atoms that may have a substituent, an alkoxyl group having 1 to 4 carbon atoms that may have a substituent, or a hydroxy group, and u represents an integer of 0 to 5, and the cyanate compound may be a mixture of compounds having different u.

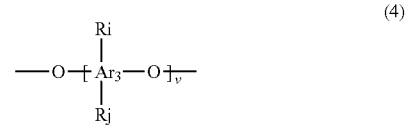

(4)

wherein $Ar_3$ represents a phenylene group that may have a substituent, a naphthylene group that may have a substituent, or a biphenylene group that may have a substituent, Ri and Rj each independently represent a hydrogen atom, an alkyl group having 1 to 6 carbon atoms that may have a substituent, an aryl group having 6 to 12 carbon atoms that may have a substituent, an alkoxyl group having 1 to 4 carbon atoms that may have a substituent, or a hydroxy group, and v represents an integer of 0 to 5, and the cyanate compound may be a mixture of compounds having different v.

(5a)

(5b)

(5c)

-continued

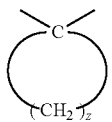 (5d)

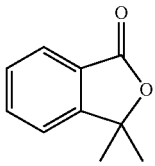 (5e)

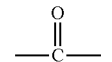 (5f)

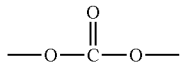 (5g)

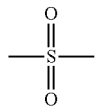 (5h)

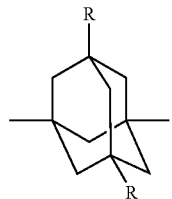 (5i)

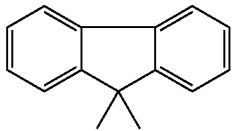 (5j)

wherein z represents an integer of 4 to 7; and R each independently represents a hydrogen atom or an alkyl group having 1 to 6 carbon atoms.

$Ar_2$ in general formula (3) and $Ar_3$ in general formula (4) are not particularly limited. Examples thereof include a 1,4-phenylene group, a 1,3-phenylene group, a 4,4'-biphenylene group, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, and a 1,4-naphthylene group.

The alkyl group and the aryl group for Rb to Rf in general formula (3) and Ri and Rj in general formula (4) are similar to those described in general formula (2).

Specific examples of the cyanate compound (A) as described above are not particularly limited. Examples thereof include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanatophenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-trimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl) ether, bis(4-cyanatophenyl) sulfide, bis(4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1- tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one, phenol novolac-based cyanate compounds, cresol novolac-based cyanate compounds, trisphenol novolac-based cyanate compounds, fluorene novolac-based cyanate compounds, phenol aralkyl-based cyanate compounds, cresol aralkyl-based cyanate compounds, naphthol aralkyl-based cyanate compounds, biphenyl aralkyl-based cyanate compounds, phenol-modified xylene formaldehyde-based cyanate compounds, modified naphthalene formaldehyde-based cyanate compounds, phenol-modified dicyclopentadiene-based cyanate compounds, naphthylene ether-based cyanate compounds, and adamantane skeleton-based cyanate compounds. One of these cyanate compounds can be used, or two or more of these other cyanate compounds can be mixed and used.

Phenol novolac resins and cresol novolac resins that are precursors of phenol novolac-based cyanate compounds and cresol novolac-based cyanate compounds are not particularly limited. Examples thereof include those obtained by reacting a phenol, an alkyl-substituted phenol, or a halogen-substituted phenol and a formaldehyde compound such as formalin or paraformaldehyde in an acidic solution by a known method.

Trisphenol novolac resins that are precursors of trisphenol novolac-based cyanate compounds are not particularly limited. Examples thereof include those obtained by reacting hydroxybenzaldehyde and a phenol in the presence of an acidic catalyst.

Fluorene novolac resins that are precursors of fluorene novolac-based cyanate compounds are not particularly limited. Examples thereof include those obtained by reacting a fluorenone compound and a 9,9-bis(hydroxyaryl)fluorene in the presence of an acidic catalyst.

Phenol aralkyl resins, cresol aralkyl resins, naphthol aralkyl resins, and biphenyl aralkyl resins that are precursors of phenol aralkyl-based cyanate compounds, cresol aralkyl-based cyanate compounds, naphthol aralkyl-based cyanate compounds, and biphenyl aralkyl-based cyanate compounds are not particularly limited. Examples thereof include those obtained by reacting a bishalogenomethyl compound as represented by $Ar_2$—$(CH_2Y)_2$ and a phenol compound with an acidic catalyst or without a catalyst by a known method, those obtained by reacting a bis(alkoxymethyl) compound as represented by $Ar_2$—$(CH_2OR)_2$ or a bis(hydroxymethyl) compound as represented by $Ar_2$—$(CH_2OH)_2$ and a phenol compound in the presence of an acidic catalyst by a known method, or those obtained by polycondensing an aromatic aldehyde compound, an aralkyl compound, and a phenol compound by a known method.

Here, Y is a halogen atom. In addition, R is an alkyl group. $Ar_2$ is similar to one described in formula (3).

Phenol-modified xylene formaldehyde resins that are precursors of phenol-modified xylene formaldehyde-based cyanate compounds are not particularly limited. Examples thereof include those obtained by reacting a xylene formaldehyde resin and a phenol compound in the presence of an acidic catalyst by a known method.

Modified naphthalene formaldehyde resins that are precursors of modified naphthalene formaldehyde-based cyanate compounds are not particularly limited. Examples thereof include those obtained by reacting a naphthalene formaldehyde resin and a hydroxy-substituted aromatic compound in the presence of an acidic catalyst by a known method.

Phenol-modified dicyclopentadiene resins, and phenolic resins having a polynaphthylene ether structure that are precursors of phenol-modified dicyclopentadiene-based cyanate compounds and naphthylene ether-based cyanate compounds are not particularly limited. Examples thereof include those obtained by subjecting a polyvalent hydroxynaphthalene compound having two or more phenolic hydroxy groups in one molecule to dehydration condensation in the presence of a basic catalyst by a known method.

Among these, phenol novolac-based cyanate compounds, naphthol aralkyl-based cyanate compounds, biphenyl aralkyl-based cyanate compounds, naphthylene ether-based cyanate compounds, phenol-modified xylene formaldehyde-based cyanate compounds, and adamantane skeleton-based cyanate compounds are preferred, and naphthol aralkyl-based cyanate compounds are particularly preferred. By using such a cyanate compound (A), the glass transition temperature tends to be more improved, the thermal expansion coefficient tends to be more decreased, and the plating adhesiveness tends to be more improved.

The content of the cyanate compound (A) can be appropriately set according to the desired characteristics and is not particularly limited, but is preferably 1 to 90 parts by mass, more preferably 20 to 70 parts by mass, and further preferably 40 to 60 parts by mass, based on 100 parts by mass of resin solid components in the resin composition. When the content of the cyanate compound (A) is in the above range, the glass transition temperature and the plating adhesiveness tend to be more improved, and the thermal expansion coefficient tends to be more decreased.

Here, the "resin solid components in the resin composition" refers to components in the resin composition excluding a solvent, the benzoguanamine compound (C) having an aminomethyl group, and a filler (D) unless otherwise noted, and "100 parts by mass of resin solid components" refers to the total of the components in the resin composition excluding the solvent, the benzoguanamine compound (C) having an aminomethyl group, and the filler (D) being 100 parts by mass.

[Maleimide Compound (B)]

As the maleimide compound (B) used in the present embodiment, those generally known can be used as long as they are compounds having one or more maleimide groups in one molecule. The type of the maleimide compound (B) is not particularly limited. By using the maleimide compound (B) in combination with the cyanate compound (A) and the benzoguanamine compound (C), the glass transition temperature, the rigidity, and the like are more improved, and the thermal expansion coefficient is more decreased.

The maleimide compound (B) is not particularly limited. Examples thereof include 4,4-diphenylmethanebismaleimide, phenylmethanemaleimide, m-phenylenebismaleimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, polyphenylmethanemaleimide, novolac-based maleimides, biphenyl aralkyl-based maleimides, and prepolymers of these maleimide compounds or prepolymers of maleimide compounds and amine compounds. One of these maleimide compounds can be used, or two or more of these maleimide compounds can be mixed and used. Among these, novolac-based maleimide compounds and biphenyl aralkyl-based maleimide compounds are particularly preferred.

The content of the maleimide compound (B) is preferably 1 to 90 parts by mass, more preferably 20 to 70 parts by mass, and further preferably 40 to 60 parts by mass, based on 100 parts by mass of the resin solid components in the resin composition. When the content of the maleimide compound (B) is in the above range, the flexibility tends to be more improved.

[Benzoguanamine Compound (C)]

The benzoguanamine compound (C) having an aminomethyl group is represented by the following general formula (1). The benzoguanamine compound (C) can be produced by hydrogen reduction of a cyanobenzoguanamine compound or reaction of a cyanobenzylamine compound and a dicyandiamide compound. By using the benzoguanamine compound (C) having such a structure in combination with the cyanate compound (A) and the maleimide compound (B), the copper foil peel strength and the plating peel strength are more improved.

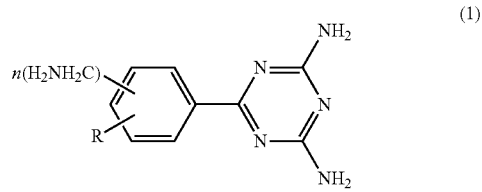

wherein R is a hydrogen atom or a substituent selected from the group consisting of a hydrocarbon group having 1 to 10 carbon atoms, an alkoxyl group having 1 to 10 carbon atoms, an aryl group having 6 to 10 carbon atoms, an aryloxy group having 6 to 10 carbon atoms, a hydroxyl group, an amide group, and a halogen atom, and n is an integer of 1 to 2.

The hydrocarbon group having 1 to 10 carbon atoms represented by R in the above formula (1) is not particularly limited. Examples thereof include an alkyl group such as a methyl group, an ethyl group, a linear or branched propyl group, a butyl group, a pentyl group, a hexyl group, a heptyl group, an octyl group, a nonyl group, a decyl group, or a cyclohexyl group; and an aryl group such as a phenyl group or a benzyl group. The hydrocarbon group may be linear, branched, or cyclic.

The alkoxyl group having 1 to 10 carbon atoms represented by R in the above formula (1) is not particularly limited. Examples thereof include a methoxy group, an ethoxy group, or a linear or branched propoxy group, a linear or branched butoxy group, or a cyclic cyclohexyloxy group.

The aryloxy group having 6 to 10 carbon atoms represented by R in the above formula (1) is not particularly limited. Examples thereof include a phenoxy group.

The halogen atom represented by R in the above formula (1) is not particularly limited. Examples thereof include a chlorine atom, a fluorine atom, or a bromine atom.

The benzoguanamine compound (C) having an aminomethyl group represented by general formula (1) is not particularly limited. Examples thereof include o-aminomethylbenzoguanamine, m-aminomethylbenzoguanamine, p-aminomethylbenzoguanamine, 3,5-bis(aminomethyl)benzoguanamine, 3,4-bis(aminomethyl)benzoguanamine, and 2,5-dimethyl-4-aminomethylbenzoguanamine. Among these, m-aminomethylbenzoguanamine and p-aminomethylbenzoguanamine are particularly preferred. By using the benzoguanamine compound (C) having such a structure, the copper foil peel strength and the plating peel strength tend to be more improved.

The content of the benzoguanamine compound (C) can be appropriately set according to the desired characteristics and is not particularly limited, but is preferably 0.5 to 30 parts by mass, more preferably 0.5 to 20 parts by mass, and further preferably 1 to 10 parts by mass, based on 100 parts by mass of the resin solid components in the resin composition. When the content of the benzoguanamine compound (C) is in the above range, the copper foil peel strength and the plating peel strength tend to be more improved.

[Filler (D)]

The resin composition in the present embodiment may further contain the filler (D) as needed. As the filler (D), known ones can be appropriately used, and the type of the filler (D) is not particularly limited. Inorganic fillers and organic fillers generally used in the industry can be preferably used.

The inorganic fillers are not particularly limited. Examples thereof include silicas such as natural silica, fused silica, synthetic silica, amorphous silica, AEROSIL, hollow silica, and white carbon; oxides such as titanium white, zinc oxide, magnesium oxide, zirconium oxide, and alumina; nitrides such as boron nitride, aggregated boron nitride, silicon nitride, and aluminum nitride; sulfates such as barium sulfate; metal hydrates such as aluminum hydroxide, heat-treated products of aluminum hydroxide (products obtained by heat-treating aluminum hydroxide to decrease some of the water of crystallization), boehmite, and magnesium hydroxide; molybdenum compounds such as molybdenum oxide and zinc molybdate; zincs such as zinc borate and zinc stannate; and other inorganic fillers such as clay, kaolin, talc, calcined clay, calcined kaolin, calcined talc, mica, E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass.

The organic fillers are not particularly limited. Examples thereof include rubber powders such as styrene-based rubber powders, butadiene-based rubber powders, and acrylic rubber powders, core-shell-based rubber powders, silicone resin powders, silicone rubber powders, and silicone composite powders.

Among these, inorganic fillers are preferred, and silicas are more preferred. One of these fillers can be used alone, or two or more of these fillers can be used in combination.

The content of the filler (D) can be appropriately set according to the desired characteristics and is not particularly limited, but is preferably 50 to 1600 parts by mass, more preferably 50 to 1000 parts by mass, and further preferably 50 to 200 parts by mass, based on 100 parts by mass of the resin solid components in the resin composition. When the content of the filler (D) is in the above range, the moldability of the resin composition tends to be more improved.

Here, when the filler (D) is used, a silane coupling agent and a wetting and dispersing agent are preferably used in combination.

As the silane coupling agent, those generally used for surface treatment of inorganic matter can be preferably used, and the type of the silane coupling agent is not particularly limited. Specific examples include aminosilane-based compounds such as γ-aminopropyltriethoxysilane and N-β-(aminoethyl)-γ-aminopropyltrimethoxysilane; epoxysilane-based compounds such as γ-glycidoxypropyltrimethoxysilane and β-(3,4-epoxycyclohexyl)ethyltrimethoxysilane; vinylsilane-based compounds such as γ-methacryloxypropyltrimethoxysilane and vinyl-tri(β-methoxyethoxy)silane; cationic silane-based compounds such as N-β-(N-vinylbenzylaminoethyl)-γ-aminopropyltrimethoxysilane hydrochloride; and phenyisilane-based compounds. One of these silane coupling agent can be used alone, or two or more of these silane coupling agents can be used in combination.

In addition, as the wetting and dispersing agent, those generally used for paints can be preferably used, and the type of the wetting and dispersing agent is not particularly limited. Preferably, copolymer-based wetting and dispersing agents are used. Specific examples thereof include Disperbyk-110, 111, 161, and 180, BYK-W996, BYK-W9010, BYK-W903, and BYK-W940 manufactured by BYK Japan KK. One of these wetting and dispersing agent can be used alone, or two or more of these wetting and dispersing agents can be used in combination.

[Other Components]

Further, the resin composition in the present embodiment may further contain one or more components selected from the group consisting of an epoxy resin, a phenolic resin, an oxetane resin, a benzoxazine resin, a compound having a polymerizable unsaturated group, and the like, as needed.

(Epoxy Resin)

As the epoxy resin, known ones can be appropriately used as long as they are epoxy resins having two or more epoxy groups in one molecule. The type of the epoxy resin is not particularly limited. Specific examples include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, naphthylene ether-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by reaction of hydroxyl group-containing silicone resins and epichlorohydrin. Among these epoxy resins, biphenyl aralkyl-based epoxy resins, naphthylene ether-based epoxy resins, polyfunctional phenol-based epoxy resins, and naphthalene-based epoxy resins are preferred in terms of flame retardancy and heat resistance. One of these epoxy resins can be used alone, or two or more of these epoxy resins can be used in combination.

As the phenolic resin, those generally known can be used as long as they are phenolic resins having two or more hydroxyl groups in one molecule. Examples of the phenolic resin (F) include, but are not particularly limited to, bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins. Among these phenolic resins, biphenyl aralkyl-based phenolic resins, naphthol aralkyl-based phenolic resins, phosphorus-containing phenolic resins, and hydroxyl group-containing silicone resins are preferred in terms of flame retardancy. One of these phenolic resins can be used alone, or two or more of these phenolic resins can be used in combination.

As the oxetane resin, those generally known can be used. Examples of the oxetane resin (G) include, but are not particularly limited to, oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyl-oxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.). One of these oxetane resins can be used alone, or two or more of these oxetane resins can be mixed and used.

As the benzoxazine compound, those generally known can be used as long as they are compounds having two or more dihydrobenzoxazine rings in one molecule. Examples of the benzoxazine compound (H) include bisphenol A-based benzoxazine BA-BXZ (trade name manufactured by Konishi Chemical Ind. Co., Ltd.), bisphenol F-based benzoxazine BF-BXZ (trade name manufactured by Konishi Chemical Ind. Co., Ltd.), and bisphenol S-based benzoxazine BS-BXZ (trade name manufactured by Konishi Chemical Ind. Co., Ltd.) and are not particularly limited. One of these benzoxazine compounds can be used alone, or two or more of these benzoxazine compounds can be mixed and used.

As the compound having a polymerizable unsaturated group, those generally known can be used. Examples of the compound (I) having a polymerizable unsaturated group include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; benzocyclobutene resins; and (bis)maleimide resins and are not particularly limited. One of these compounds having an unsaturated group can be used alone, or two or more of these compounds having an unsaturated group can be mixed and used.

(Curing Accelerator)

In addition, the resin composition in the present embodiment may contain a curing accelerator for appropriately adjusting the curing rate, as needed. As this curing accelerator, those generally used as curing accelerators for cyanate compounds, epoxy resins, and the like can be preferably used, and the type of the curing accelerator is not particularly limited. Specific examples thereof include organometallic salts such as zinc octylate, zinc naphthenate, cobalt naphthenate, copper naphthenate, acetylacetone iron, nickel octylate, and manganese octylate; phenol compounds such as phenol, xylenol, cresol, resorcin, catechol, octyl phenol, and nonyl phenol; alcohols such as 1-butanol and 2-ethylhexanol; imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole and derivatives such as adducts of carboxylic acids of these imidazoles or acid anhydrides thereof; amines such as dicyandiamide, benzyldimethylamine, and 4-methyl-N,N-dimethylbenzylamine; phosphorus compounds such as phosphine-based compounds, phosphine oxide-based compounds, phosphonium salt-based compounds, and diphosphine-based compounds, peroxides such as epoxy-imidazole adduct-based compounds, benzoyl peroxide, p-chlorobenzoyl peroxide, di-t-butyl peroxide, diisopropyl peroxycarbonate, and di-2-ethylhexyl peroxycarbonate; or azo compounds such as azobisisobutyronitrile. One of these curing accelerator can be used alone, or two or more of these curing accelerators can be used in combination.

The amount of the curing accelerator used can be appropriately adjusted considering the degrees of cure of the resins, the viscosity of the resin composition, and the like and is not particularly limited, but is usually 0.005 to 10 parts by mass based on 100 parts by mass of the resin solid components in the resin composition.

Further, various polymer compounds such as another thermosetting resin, a thermoplastic resin and an oligomer thereof, and an elastomer, a flame-retardant compound, various additives, and the like can be used in combination in the resin composition in the present embodiment as needed. These are not particularly limited as long as they are those generally used. Examples of the flame-retardant compound include bromine compounds such as 4,4'-dibromobiphenyl, phosphates, melamine phosphate, phosphorus-containing epoxy resins, nitrogen compounds such as melamine and benzoguanamine, oxazine ring-containing compounds, and silicone-based compounds. In addition, examples of the various additives include ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these can be used alone or two or more of these can be used in combination as desired.

(Organic Solvent)

An organic solvent can be used in the resin composition in the present embodiment as needed. In this case, the resin composition in the present embodiment can be used as a form (solution or varnish) in which at least some, preferably all, of the above-described various resin components are dissolved in or compatible with the organic solvent. As the organic solvent, known ones can be appropriately used as long as they can dissolve or be compatible with at least some, preferably all, of the above-described various resin components. The type of the organic solvent is not particularly limited. Specific examples include polar solvents such as ketones such as acetone, methyl ethyl ketone, and methyl isobutyl ketone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, methyl methoxypropionate, and methyl hydroxyisobutyrate; and amides such as dimethylacetamide and dimethylformamide; and nonpolar solvents such as aromatic hydrocarbons such as toluene and xylene. One of these can be used alone, or two or more of these can be used in combination.

[Applications]

The resin composition in the present embodiment can be used as an insulating layer of a printed wiring board and a semiconductor package material. For example, the resin composition in the present embodiment can be used as materials constituting a prepreg, a metal foil-clad laminate using the prepreg, a resin composite sheet, and a printed wiring board. These will be described below.

[Prepreg]

A prepreg in the present embodiment comprises a base material; and the above resin composition with which the base material is impregnated or coated. The method for producing the prepreg is not particularly limited as long as it is a method of combining the resin composition in the present embodiment and a base material to produce a prepreg. Specifically, the prepreg in the present embodiment can be produced by impregnating or coating a base material with the resin composition in the present embodiment and then semi-curing the resin composition by a method of drying at 120 to 220° C. for about 2 to 15 minutes, or the like. At this time, the amount of the resin composition adhered to the base material, that is, the amount of the resin composition (including the benzoguanamine compound (C) and the filler (D)) based on the total amount of the prepreg after the semi-curing, is preferably in the range of 20 to 99% by mass.

As the base material used when the prepreg in the present embodiment is produced, known ones used for various printed wiring board materials can be used. Examples of the base material include, but are not particularly limited to, woven fabrics of fibers of glass such as E glass, D glass, L glass, S glass, T glass, Q glass, UN glass, NE glass, and spherical glass; inorganic fibers of materials other than glass, such as quartz; organic fibers of polyimides, polyamides, polyesters, and the like; liquid crystal polyesters; and the like. As the shape of the base material, woven fabrics, nonwoven fabrics, rovings, chopped strand mats, surfacing mats, and the like are known, and the shape of the base material may be any. One of these base material can be used alone, or two or more of these base materials can be used in combination. In addition, the thickness of the base material is not particularly limited, but is preferably in the range of 0.01 to 0.2 mm in laminate applications. Particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, and the like are preferred from the viewpoint of moisture absorption heat resistance. In addition, liquid crystal polyester woven fabrics are preferred in terms of electrical characteristics.

[Metal Foil-Clad Laminate]

A metal foil-clad laminate in the present embodiment comprises the above-described prepreg or a laminate of two or more of the prepregs; and metal foil disposed on one surface or both surfaces of the prepreg or the laminate. The method for producing the metal foil-clad laminate is not particularly limited, and, for example, the metal foil-clad laminate can be fabricated by stacking one or a plurality of the above-described prepregs, disposing foil of a metal such as copper or aluminum on one surface or both surfaces of the stack, and laminate-molding the metal foil and the stack. The metal foil used here is not particularly limited as long as it is one used for a printed wiring board material. Copper foil such as rolled copper foil and electrolytic copper foil is preferred. In addition, the thickness of the metal foil is not particularly limited, but is preferably 2 to 70 μm, more preferably 3 to 35 μm. As the molding conditions, usual methods for laminates and multilayer boards for printed wiring boards can be applied. For example, the metal foil-clad laminate in the present embodiment can be produced by laminate-molding with a temperature of 180 to 350° C., a heating time of 100 to 300 minutes, and a surface pressure of 20 to 100 kg/cm$^2$ using a multistage press, a multistage vacuum press, a continuous molding machine, an autoclave molding machine, or the like. In addition; a multilayer board can also be provided by laminate-molding the above prepreg and a separately fabricated wiring board for an inner layer in combination. As the method for producing a multilayer board, for example, a multilayer board can be fabricated by disposing 35 μm copper foil on both surfaces of one of the above-described prepreg, laminating and forming the copper foil and the prepreg under the above conditions, then forming inner layer circuits, subjecting these circuits to blackening treatment to form an inner layer circuit board, then alternately disposing these inner layer circuit boards and the above prepregs one by one, further disposing copper foil on the outermost layers, and laminate-molding the copper foil, the inner layer circuit boards, and the prepregs under the above conditions preferably under vacuum. The metal foil-clad laminate in the present embodiment can be preferably used as a printed wiring board.

[Printed Wiring Board]

A printed wiring board in the present embodiment comprises an insulating layer and a conductor layer formed on a surface of the insulating layer, and the insulating layer comprises a resin composition. The insulating layer is not particularly limited as long as it comprises a resin composition. The insulating layer may comprise a resin composition alone or be a prepreg. Such a printed wiring board can be produced according to an ordinary method, and the method for producing the printed wiring board is not particularly limited. One example of a method for producing a printed wiring board will be shown below. First, a metal foil-clad laminate such as the above-described copper-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed. Then, the required number of the above-described prepregs are stacked on the inner layer circuit surfaces, metal foil for outer layer circuits is further laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

The printed wiring board obtained in the above production example has a configuration in which it has insulating layers and conductor layers formed on surfaces of these insulating layers, and the insulating layers comprise the resin composition in the present embodiment described above. In other words, the prepreg in the present embodiment described above (the base material and the resin composition in the present embodiment with which the base material is impregnated or coated) and the resin composition layer of the metal foil-clad laminate in the present embodiment described above (the layer comprising the resin composition in the present embodiment) are composed of an insulating layer comprising the resin composition in the present embodiment.

[Resin Composite Sheet]

A resin composite sheet in the present embodiment comprises a support; and a resin composition with which the support is coated and which is dried. The resin composite sheet can be used as a buildup film or a dry film solder resist. The method for producing the resin composite sheet is not particularly limited, and, for example, the resin composite sheet can be obtained by coating a support with a solution of the above resin composition in the present embodiment dissolved in a solvent and drying the solution.

Examples of the support used here include, but are not particularly limited to, organic film substrates such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped supports such as glass plates, SUS plates, and FRP.

Examples of the coating method include a method of coating a support with a solution of the resin composition in the present embodiment dissolved in a solvent by a bar coater, a die coater, a doctor blade, a baker applicator, or the like. In addition, a single-layer sheet (resin sheet) can also be provided by peeling or etching the support from the resin sheet in which the support and the resin composition are laminated, after drying. A single-layer sheet (resin sheet) can also be obtained without using a support by supplying a solution of the above resin composition in the present embodiment dissolved in a solvent into a mold having a sheet-shaped cavity, and drying the solution, or the like for molding into a sheet shape.

In fabrication of the single-layer sheet (resin sheet) or laminated sheet (resin composite sheet) in the present embodiment, the drying conditions when the solvent is removed are not particularly limited, but are preferably a temperature of 20° C. to 200° C. for 1 to 90 minutes because at low temperature, the solvent is likely to remain in the resin composition, and at high temperature, curing of the resin composition proceeds. In addition, the resin composition can also be used in an uncured state in which the solvent is only dried, or in a semi-cured (B-staged) state as needed. In addition, the thickness of the resin layer of the single-layer or laminated sheet in the present embodiment can be adjusted by the concentration and coating thickness of the solution of the resin composition in the present embodiment and is not particularly limited, but is preferably 0.1 to 500

μm because generally, when the coating thickness increases, the solvent is likely to remain during drying.

EXAMPLES

The present invention will be described in more detail below by showing Synthesis Examples, an Example, and a Comparative. Example, but the present invention is not limited to these.

Synthesis Example 1

Synthesis of Cyanate Compound 300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane, and this solution was a solution 1.

125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were mixed. While the obtained mixed liquid was kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 cm$^{-1}$ (cyanate groups) and showed no absorption of hydroxy groups.

Synthesis Example 2

Synthesis of Benzoguanamine Compound Having Aminomethyl Group

A 200 mL three-necked flask equipped with a thermometer sheath tube and a reflux condenser was charged with 12.8 g of isophthalonitrile, 8.45 g of dicyandiamide, 0.95 g of potassium hydroxide, and 128 g of 1-butanol, and the mixture was heated to reflux under atmospheric pressure and stirring at 120° C. for 1 hour. Then, the mixture was allowed to cool, and the precipitated crystals were filtered, washed with a small amount of methanol, and then vacuum-dried to obtain m-cyanomethylguanamine.

Next, a pressure-resistant container made of stainless steel, having an internal volume of 100 mL, and equipped with a thermometer sheath tube and a pressure gauge was charged with 3.2 g of the obtained m-cyanomethylguanamine, 0.14 g of sodium hydroxide, 0.5 g of a commercial sponge nickel catalyst (R-200 manufactured by Nikko Rica Corporation), and 30 g of methyl cellosolve as a solvent, and nitrogen replacement was performed in the reactor. Then, pressure was applied to 5 MPa with hydrogen, and the reactor was sealed. With stirring, the container was heated and maintained at 60° C. for 2 hours. Then, after cooling and pressure dropping, the catalyst and the impurities were separated from the reaction liquid, and further the solvent was concentrated by an evaporator to recrystallize the product to obtain white crystals of m-aminomethylbenzoguanamine.

Example 1

50 parts by mass of the SNCN obtained by Synthesis Example 1, 50 parts by mass of a phenol novolac-based bismaleimide compound (BMI-2300, manufactured by Daiwa Fine Chemicals Co., Ltd.), 2 parts by mass of the m-aminomethylbenzoguanamine obtained by Synthesis Example 2, 100 parts by mass of fused silica (SC2050 MB, manufactured by Admatechs Company Limited), and 0.10 parts by mass of zinc octylate (manufactured by Nihon Kagaku Sangyo Co., Ltd.) were mixed to obtain a varnish. This varnish was diluted with methyl ethyl ketone, and an E-glass woven fabric having a thickness of 0.1 mm was impregnated and coated with the diluted varnish and heated and dried at 150° C. for 5 minutes to obtain a prepreg having a resin content of 50% by mass.

Eight of the obtained prepregs were stacked, and 12 μm thick electrolytic copper foil (3EC-M3-VLP, manufactured by MITSUI MINING & SMELTING CO., LTD.) was disposed on the top and the bottom. The stack was laminate-molded at a pressure of 30 kgf/cm$^2$ and a temperature of 220° C. for 120 minutes to obtain a metal foil-clad laminate having an insulating layer thickness of 0.8 mm. Evaluation of copper foil peel strength and plating peel strength was performed using the obtained metal foil-clad laminate. The results are shown in Table 1.

Comparative Example 1

A metal foil-clad laminate having a thickness of 0.8 mm was obtained as in Example 1 except that m-aminomethylbenzoguanamine was not used in Example 1. The evaluation results of the obtained metal foil-clad laminate are shown in Table 1.

(Measurement Methods and Evaluation Methods)
1) Copper Foil Peel Strength:
For the copper foil peel strength, an average value obtained by measuring three times in accordance with JIS C6481 was obtained.
2) Plating Peel Strength:
For each of the metal foil-clad laminates obtained in Example 1 and Comparative Example 1, electroless copper plating of about 0.8 μm was provided by the process of electroless copper plating manufactured by C. Uyemura & Co., Ltd. (names of chemical solutions used: MCD-PL, MDP-2, MAT-SP, MAB-4-C, MEL-3-APEA ver. 2), and drying was performed at 130° C. for 1 hour. Next, electrolytic copper plating was provided so that the thickness of plating copper was 18 μm, and drying was performed at 180° C. for 1 hour. In this manner, a sample in which a conductor layer (plating copper) having a thickness of 18 μm was formed on an insulating layer was fabricated and evaluated. Using the obtained sample, the adhesive force of the plating copper (plating peel strength) was measured three times in accordance with JIS C6481, and the average value was obtained.

TABLE 1

|  |  | Example 1 | Comparative Example 1 |
|---|---|---|---|
| Copper foil peel strength | kN/m | 0.88 | 0.78 |
| Plating peel strength | kN/m | 0.54 | 0.48 |

As is clear from Table 1, it was confirmed that by using the resin composition of the present invention, a prepreg, a printed wiring board, and the like having excellent copper foil peel strength and plating peel strength were realized.

This application is based on Japanese Patent Application No. 2015-019302 filed with the Japan Patent Office on Feb. 3, 2015, the contents of which are incorporated herein by reference.

INDUSTRIAL APPLICABILITY

As described above, the resin composition of the present invention can be widely and effectively used in various applications such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively used as printed wiring board materials adapted to higher integration and higher density for information terminal equipment, communication equipment, and the like in recent years. In addition, the laminate, metal foil-clad laminate, and the like of the present invention have performance also excellent in copper foil peel strength and plating peel strength, and therefore their industrial practicality is extremely high.

The invention claimed is:

1. A resin composition comprising:
   a cyanate compound (A);
   a maleimide compound (B); and
   a benzoguanamine compound (C) having an aminomethyl group represented by the following general formula (1):

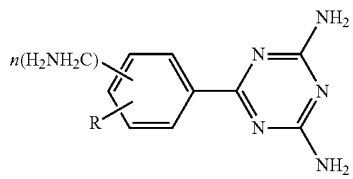

(1)

wherein R is a hydrogen atom or a substituent selected from the group consisting of a hydrocarbon group having 1 to 10 carbon atoms, an alkoxyl group having 1 to 10 carbon atoms, an aryloxy group having 6 to 10 carbon atoms, a hydroxyl group, an amide group, and a halogen atom, and n is an integer of 1 to 2.

2. The resin composition according to claim 1, wherein
   the benzoguanamine compound (C) comprises a m-aminomethylbenzoguanamine and/or p-aminomethylbenzoguanamine.

3. The resin composition according to claim 1, wherein
   a content of the benzoguanamine compound (C) is 0.5 to 30 parts by mass based on 100 parts by mass of resin solid components.

4. The resin composition according to claim 1, further comprising:
   a filler (D).

5. The resin composition according to claim 1, further comprising:
   one or more components selected from the group consisting of an epoxy resin, a phenolic resin, an oxetane resin, a benzoxazine resin, and a compound having a polymerizable unsaturated group.

6. The resin composition according to claim 4, wherein
   a content of the filler (D) is 50 to 1600 parts by mass based on 100 parts by mass of the resin solid components.

7. A prepreg comprising:
   a base material; and
   the resin composition according to claim 1 with which the base material is impregnated or coated.

8. A metal foil-clad laminate comprising:
   the prepreg according to claim 7 or a laminate of two or more of the prepregs; and
   metal foil disposed on one surface or both surfaces of the prepreg or the laminate.

9. A resin composite sheet comprising:
   a support; and
   the resin composition according to claim 1 with which the support is coated and which is dried.

10. A printed wiring board comprising:
    an insulating layer; and
    a conductor layer formed on a surface of the insulating layer, wherein
    the insulating layer comprises the resin composition according to claim 1.

* * * * *